US007268467B2

(12) United States Patent
De Vries

(10) Patent No.: US 7,268,467 B2
(45) Date of Patent: Sep. 11, 2007

(54) ACOUSTIC TRANSDUCER

(75) Inventor: Gerard Hendrik Josephus De Vries, Engelen (NL)

(73) Assignee: Duran Audio B.V., Zaltbommel (NL)

( * ) Notice: Subject to any disclaimer, the term of this patent is extended or adjusted under 35 U.S.C. 154(b) by 170 days.

(21) Appl. No.: 10/504,542

(22) PCT Filed: Feb. 14, 2003

(86) PCT No.: PCT/NL03/00112

§ 371 (c)(1),
(2), (4) Date: Aug. 13, 2004

(87) PCT Pub. No.: WO03/069952

PCT Pub. Date: Aug. 21, 2003

(65) Prior Publication Data

US 2005/0127783 A1 Jun. 16, 2005

(30) Foreign Application Priority Data

Feb. 14, 2002 (NL) .................................... 1019961

(51) Int. Cl.
*H05K 5/00* (2006.01)
*H04R 1/20* (2006.01)
*H01L 41/09* (2006.01)

(52) U.S. Cl. ...................... 310/328; 181/150; 181/152; 181/192; 381/340

(58) Field of Classification Search ................ 181/150, 181/152, 192; 381/340; 310/328
See application file for complete search history.

(56) References Cited

U.S. PATENT DOCUMENTS

| | | | | |
|---|---|---|---|---|
| 1,962,300 | A | 6/1934 | Ephraim | |
| 2,878,887 | A | 3/1959 | Potter | |
| 4,214,298 | A | 7/1980 | Propst et al. | |
| 5,359,158 | A | 10/1994 | Queen | |
| 6,581,719 | B2 * | 6/2003 | Adamson | 181/182 |
| 7,044,265 | B2 * | 5/2006 | Murphy | 181/192 |
| 7,068,805 | B2 * | 6/2006 | Geddes | 381/340 |

FOREIGN PATENT DOCUMENTS

| | | | |
|---|---|---|---|
| EP | 0550159 A2 | * | 7/1993 |
| JP | 07-322387 | * | 12/1995 |

OTHER PUBLICATIONS

International Search Report Jun. 2, 2004.

* cited by examiner

*Primary Examiner*—Thomas M. Dougherty
(74) *Attorney, Agent, or Firm*—Browdy and Neimark PLLC

(57) ABSTRACT

An acoustic transducer provided with at least one sound source for generating an acoustic centre and a predetermined construction for guiding sound generated by the acoustic centre, which acoustic transducer can be fixed to a fixing wall, wherein the predetermined construction is so designed that, during operation, the generated sound is displaced by the predetermined construction to a displaced acoustic centre at a location that is on the fixing wall (5), when the acoustic transducer (10) is fixed to the fixing wall (5).

20 Claims, 3 Drawing Sheets

ACOUSTIC TRANSDUCER

FIELD OF THE INVENTION

The invention relates to an acoustic transducer provided with at least one sound source for generating an acoustic centre and a predetermined construction for guiding sound generated by the acoustic centre, which acoustic transducer can be fixed to a fixing wall.

STATE OF THE ART

FIG. 1 shows a transducer 2 that is known from the state of the art, wherein the known transducer 2 is mounted in a manner known from the state of the art. The known transducer 2 consists of a compression driver and a horn (both not shown), which according to the state of the art convert electrical signals into an acoustic wave front and disseminate this through the area. The known transducer can, however, also be another transducer known from the state of the art, such as, for example, a cone loudspeaker.

If such a known transducer 2, suitable for reproducing acoustic signals, is mounted some distance away from a fixing wall, that is to say a sound-reflecting surface 5, some of the sound energy radiated will travel directly from the known transducer 2 to the sound-reflecting surface 5 and be reflected from the latter. Such reflections are termed primary reflections. This means that an observer 1 hears both sound that originates directly from the known transducer 2 and sound that originates from the reflection from the sound-reflecting surface 5. The direct sound and the reflected sound have both travelled a different distance between leaving the known transducer 2 and reaching the observer 1 and thus a phase difference is produced between the direct and the reflected sound at the location of the observer 1. This phase difference results in location-dependant destructive interferences in the listening plane that can degrade the sound quality in the listening position. This effect can also be modelled using, instead of reflections, the addition of a virtual sound source 3, which is the same distance away on the other side of the sound-reflecting surface 5. This virtual sound source 3 can be defined as the sound source associated with the reflected sound.

The production of destructive interference is, in particular, a problem in the case of known transducers 2 that are installed in relatively low and acoustically hard environments, such as tunnels and multi-storey car parks, where the walls are made of concrete or hard plating and where the walls reflect the sound well.

The aim of the present invention is to provide a transducer that, by means of correct fixing to a wall, is able to prevent primary reflections, which results in a substantial reduction in the destructive interferences in the listening plane. To this end the invention relates to a transducer of the type mentioned in the preamble, characterised in that the predetermined construction is so designed that, during operation, the generated sound is displaced by the predetermined construction to a displaced acoustic centre at a location that is on the fixing wall, when the acoustic transducer is fixed to the fixing wall.

BRIEF DESCRIPTION OF THE FIGURES

The invention will be discussed with reference to a few figures, which, however, are intended merely to illustrate the invention and in no way whatsoever have a restrictive effect on the scope of the invention, which is determined solely by the appended claims.

DETAILED DESCRIPTION

It will be clear that the embodiment described below is described merely by way of example and not with any limiting significance and that various changes and modifications are possible without going beyond the scope of the invention and that the scope is determined solely by the appended claims.

Figure 1:
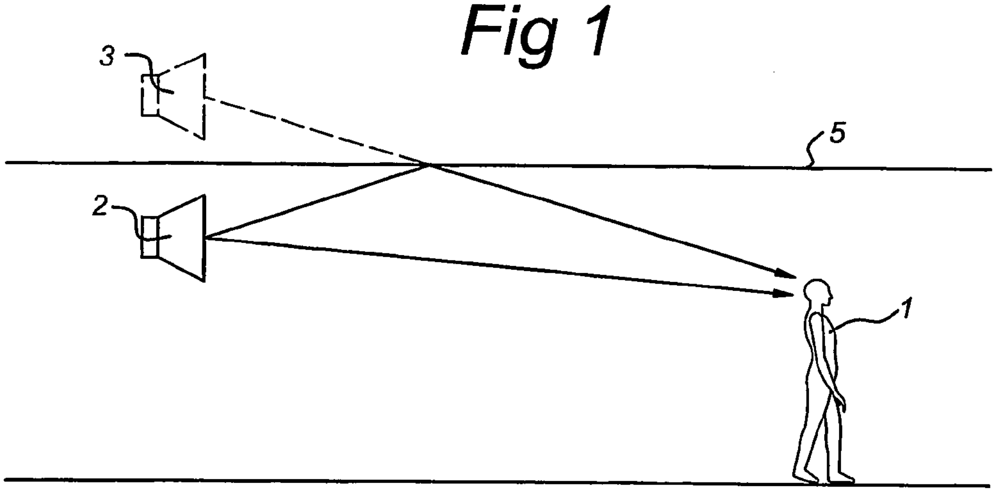
FIG. 1 shows a diagrammatic overview of the functioning of a known transducer according to the state of the art.
Figure 2:
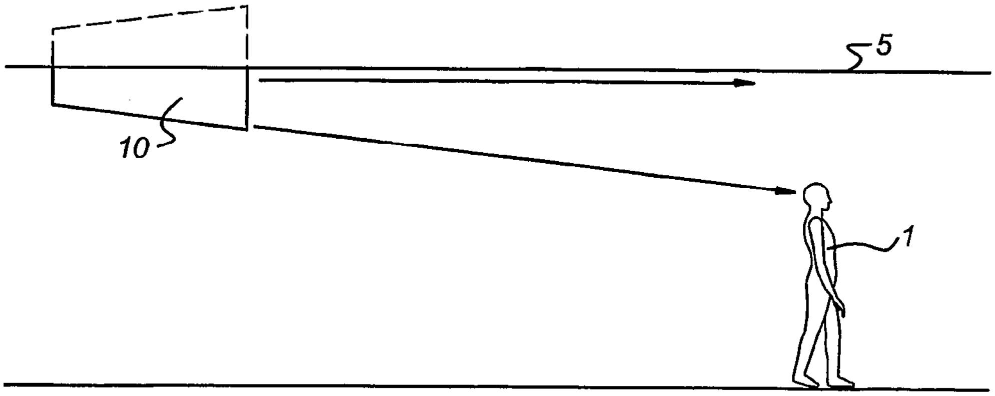
FIG. 2 shows a diagrammatic overview of the functioning of a transducer according to the present invention.

In FIG. 2 an observer 1 can be seen who hears sound originating from a transducer 10 according to the present invention that has been mounted in the immediate vicinity of a sound-reflecting surface 5.

The sound can be either a spoken message or a warning signal, music or any other acoustic signal.

The transducer 10 is so constructed that the acoustic centre is located in the sound-reflecting surface 5, the acoustic centre having to be regarded as the point or the set of points from which, according to the observer 1, the sound appears to originate. In this way the observer 1 hears only sound that originates directly from the transducer 10. In this way destructive interferences in the listening plane are prevented, which makes better detection of the sound reproduced by the transducer 10 possible.

Figure 3A:
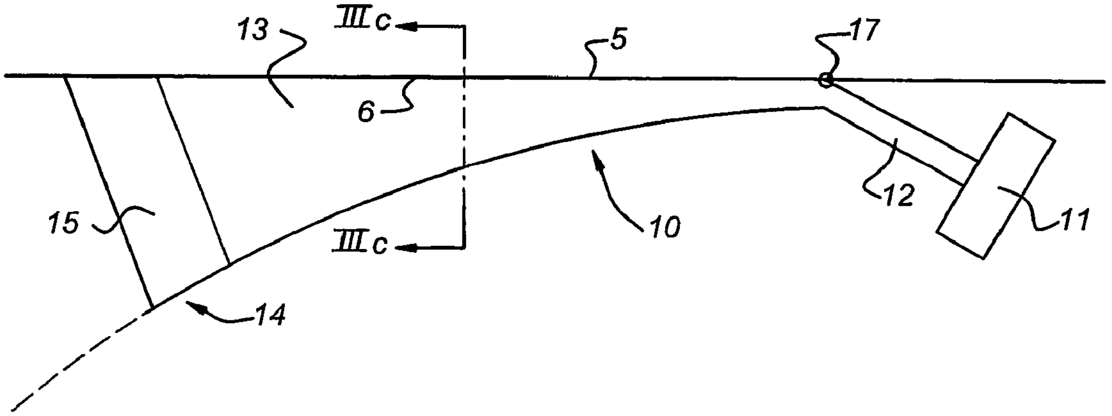
FIG. 3*a* shows a diagrammatic side view of a first preferred embodiment of the invention.

FIG. 3*a* shows a preferred embodiment of the transducer 10, which consists of a compression driver 11, a neck-shaped transition 12 and a horn 13. Furthermore, the transducer 10 comprises a flange 14 and a removable horn mouth 15. The compression driver 11 is connected to the neck-shaped transition 12 and the neck-shaped transition 12 is connected to the horn 13 for transmitting a sound signal. There is a slight kink 17 at the location of the connection between the neck-shaped transition 12 and the horn 13. The transducer 10 has a mounting surface 6 for fixing to the sound-reflecting surface 5.

Figure 3B:
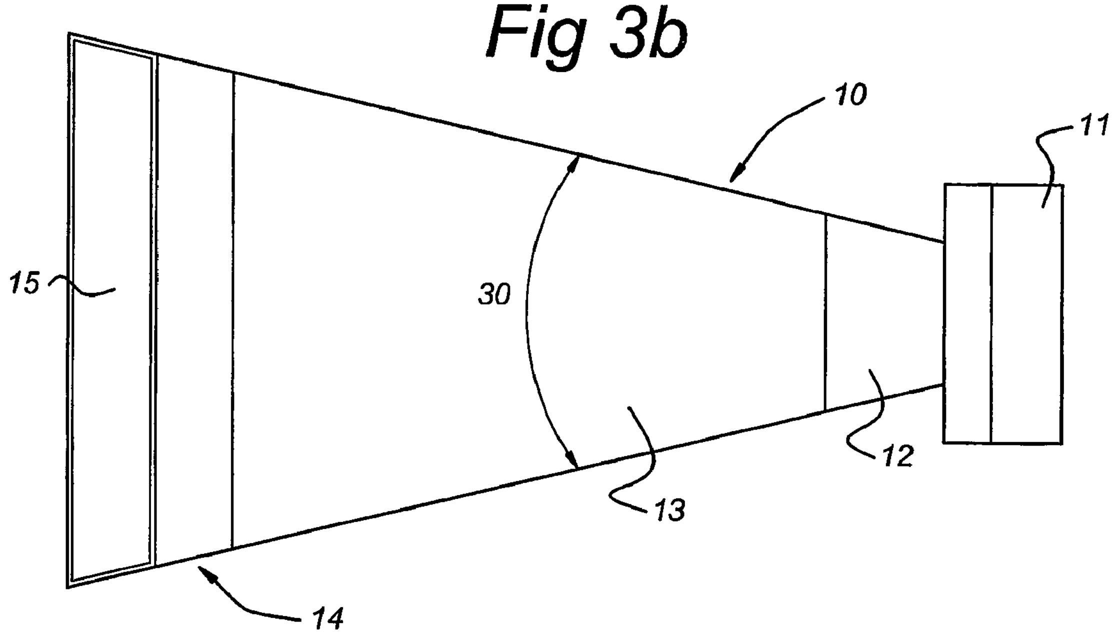
FIG. 3*b* shows a diagrammatic bottom view of the first preferred embodiment of the invention.

FIG. 3*b* shows a bottom view of FIG. 3*a*, the horizontal angle between the side walls of the horn 13 being indicated as angle 30.

Figure 3C:
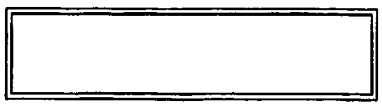
FIG. 3*c* shows the rectangular cross section of the transducer.

A cross-sectional line IIIc-IIIc is indicated in FIG. 3*a*. A cross-section of the transducer 10 along said line gives a rectangular cross-section, as shown in FIG. 3*c*, which increases in the direction away from the neck-shaped transition 12.

Figure 4:
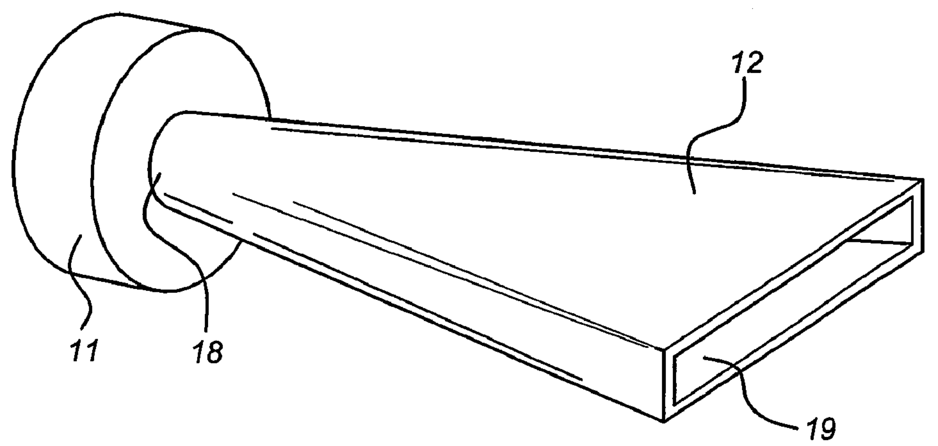
FIG. 4 shows a few components of FIG. 3 from a different viewpoint.

FIG. 4 shows part of the transducer 10 in FIGS. 3*a* and 3*b* from a different viewpoint. In this figure only the compression driver 11 and the neck-shaped transition 12 are shown. An outlet 18 of the compression driver 11 and an outlet 19 of the neck-shaped transition 12 are also shown in this figure.

The compression driver 11 can be, for example, an electrodynamic loudspeaker that provides for the conversion of an electrical input signal into an acoustic wave front. The input of the electrical input signal is not shown. The way in which this takes place or can take place is known to those skilled in the art. There are no further restrictions in this regard.

The compression driver 11 can be, for example, an 80 watt compression driver 11 having an outlet 18 with a diameter of 5.08 cm, which in the embodiment shown generates a circular flat wave front with a low amplitude and a relatively high pressure at the outlet 18 of the compression driver 11. As is known to those skilled in the art, a first order high pass filter (not shown) can be used to restrict the power that is supplied to the compression driver 11 beyond its operating range. Similarly, pass filters of higher order can be used, as is known to those skilled in the art.

However, other compression drivers 11 known from the state of the art can also be used.

The function of the neck-shaped transition 12 is to transform the wave front originating from the compression driver 11 into a shape that corresponds to the shape of the horn 13, as is shown in FIG. 4. The compression driver 11 generates an acoustic centre.

In the example described and shown here, the circular wave front at the outlet 18 of the compression driver 11, originating from the acoustic centre, is transformed into a rectangular wave front having a small dimension of typically 2.5 cm in a first direction and a dimension in a second direction, perpendicular to the first direction, of approximately 16 cm. In use, the first direction will usually be vertical and the second direction horizontal. Other directions are, however, possible. Depending on the intended use, design requirements and the like, other dimensions can also be used.

The shape of the neck-shaped transition 12 is such that the acoustic centre is displaced from the outlet 18 of the driver 11 to a displaced acoustic centre that is located at the outlet 19 of the neck-shaped transition 12, which is so positioned that this outlet 19 is in contact with the sound-reflecting surface 5 after fixing to surface 5. In this case the direct sound and reflected sound are coincident and they are no longer able adversely to interfere with one another at the location of the listener 1. In order words, the position of the acoustic centre has been displaced to the reflecting surface 5.

The outlet 19 of the neck-shaped transition 12 merges into the start of the horn 13. As can be seen in FIG. 3*a*, the wave front makes a slight kink 17 at this point. Depending on the frequencies of the sound used, this kink 17 will or will not have an influence on the reproduction of the sound. For frequencies for which the wavelength is greater than the first dimension of the neck-shaped transition 12 this kink will have no effect. In the case described here, by way of example, the neck-shaped transition 12 has a first dimension of 2.5 cm at the location of the horn 13. This means that the kink 17 will have no effect on frequencies lower than approximately 13,000 Hz. For these relatively low frequencies the outlet 19 of the neck-shaped transition 12 will behave as a line source located in the sound-reflecting surface 5.

The second dimension of the neck-shaped transition 12 is such that the latter closely adjoins the horn 13.

The horn 13 can have a wide variety of shapes depending on the requirements in respect of the horn 13, as is known to those skilled in the art. The shape of the horn 13 determines both the radiation characteristic and the acoustic impedance as a function of the frequency of the sound signal for the acoustic centre displaced to the fixing surface 5.

Various shapes of the horn 13 are known from the state of the art.

In FIGS. 3*a* and 3*b* a horn 13 having a rectangular frontal cross-section IIIc-IIIc is shown, the surface area of this rectangular frontal cross-section IIIc-IIIc increasing exponentially towards the outlet of the horn 13. It is known that this shape gives the flattest acoustic impedance curve. Typical values for this design of the vertical opening angle are 40° for a sound signal having a frequency of 250 Hz and 15° for a sound signal having a frequency of 1000 Hz.

These values are obtained by determining the curve for the sound strength for specific frequencies of the sound, along a vertical arc around the source and determining the angle associated with the line section on said arc on which the value of the sound strength is less than 6 dB weaker than the maximum value on that line section.

In order to optimise the sound pressure distribution on the listening plane a relatively short distance away from the transducer 10, the horn mouth 15 can be positioned at an angle with respect to the sound-reflecting surface 5, as is the case in FIGS. 3*a* and 3*b*.

Since the horn 13 described here has a rectangular frontal cross-section IIIc-IIIc, the horizontal radiation characteristic is determined by the angle 30 between the side walls of the horn 13. However, this applies only for frequencies for which the wavelength is less than the dimensions of the horn mouth 15.

If the transducer 10 is used, for example, in a road tunnel, it is then advisable to keep the angle 30 small in order to reduce reflections at vertical side walls of the tunnel and the like and to bundle all sound energy in a relatively narrow strip. In the preferred embodiment shown in FIGS. 3*a* and 3*b*, where angle 30 has a value of 36°, the following were found as typical values for the horizontal opening angle: 60° for a sound signal having a frequency of 250 Hz and 26° for a sound signal having a frequency of 1000 Hz.

These values are obtained by determining the curve for the sound strength, for specific frequencies of the sound, along a horizontal arc around the source and determining the angle associated with the line section on said arc on which the value of the sound strength is less than 6 dB weaker than the maximum value on that line section.

The mounting surface 6 is the part of the horn 13 that is placed against the sound-reflecting surface 5. This mounting surface 6 can be provided with fixing means for fixing the transducer 10 in an intended location on the sound-reflecting surface 5.

The end of the horn 13 consists of the flange 14 to which the horn mouth 15 can be fixed. This offers the possibility of stretching a fine mesh steel gauze in front of the horn outlet, which can offer protection against, for example, the ingress of water, as can be the case with high pressure cleaning, or other possible sources of damage.

If the transducer 10 is used on ceilings of road tunnels or multi-storey car parks there is a risk of damage from collision by a vehicle. By virtue of the construction with the removable horn mouth 15, it is possible, if the damage is restricted to the horn mouth 15, to replace the horn mouth 15 instead of the entire transducer 10.

It is also possible by omitting the horn mouth 15 to obtain a transducer 10 which has a limited dimension in the vertical direction. This can also be advantageous in car tunnels and multi-storey car parks.

The transducer 10 described above has the additional advantage that the construction has a low height, which is an obvious advantage when used in contact with reflecting surfaces in road tunnels and multi-storey car parks and the like. A typical dimension for the height of the embodiment of the transducer 10 described here is 32 cm.

In the loudspeaker according to the invention the compression driver 11 can optionally be connected to a matching transformer, by means of which the transducer 10 can easily be matched to an available input signal, for example the widely used 100 volt installations.

The compression driver 11 can be covered by a cap, which optionally offers space for fitting the matching transformer.

The horn 13 can be made of polyester, but also of other plastics, such as, for example, polyurethane, and metals, such as, for example, steel or aluminium. The transducer 10 can also be made of wood or concrete or other materials suitable for this purpose. It is also possible to integrate the horn 13 in the construction of the sound-reflecting wall 5 and thus to leave space for fixing the neck-shaped transition 12, the compression driver 11 and any other components.

The material can be sandwiched composite material or adapted in some other way to increase the rigidity and damp any resonance. The material used is preferably fire-retardant.

Tests on the transducer 10 described above have clearly shown the good performance that the transducer 10 is able to deliver. The tests were carried out in a room where the RT60 time was more than 6 seconds. The RT60 time is defined as the time needed for the sound intensity to decrease by 60 dB, measured from the point in time when the sound source is switched off.

These tests have demonstrated that the transducer 10 is capable of generating a virtually constant sound pressure of approximately 100 dB(A) and that the transducer 10 has a speech transmission index of 0.55 or more for distances of up to 75 meters, in conditions with characteristic background noise level. The speech transmission index was determined in accordance with a method which is known to those skilled in the art.

Furthermore, the transducer 10 has a high directivity. The term directivity denotes the ratio between the sound pressure measured at the direction point of the transducer 10 and the sound pressure at that point as if the transducer had been a transducer 10 purely radiating all round.

The transducer 10 furthermore has a very high yield of 136 dB at a distance of 1 meter from the horn 13 when using an input power of 50 watt.

Figure 5:
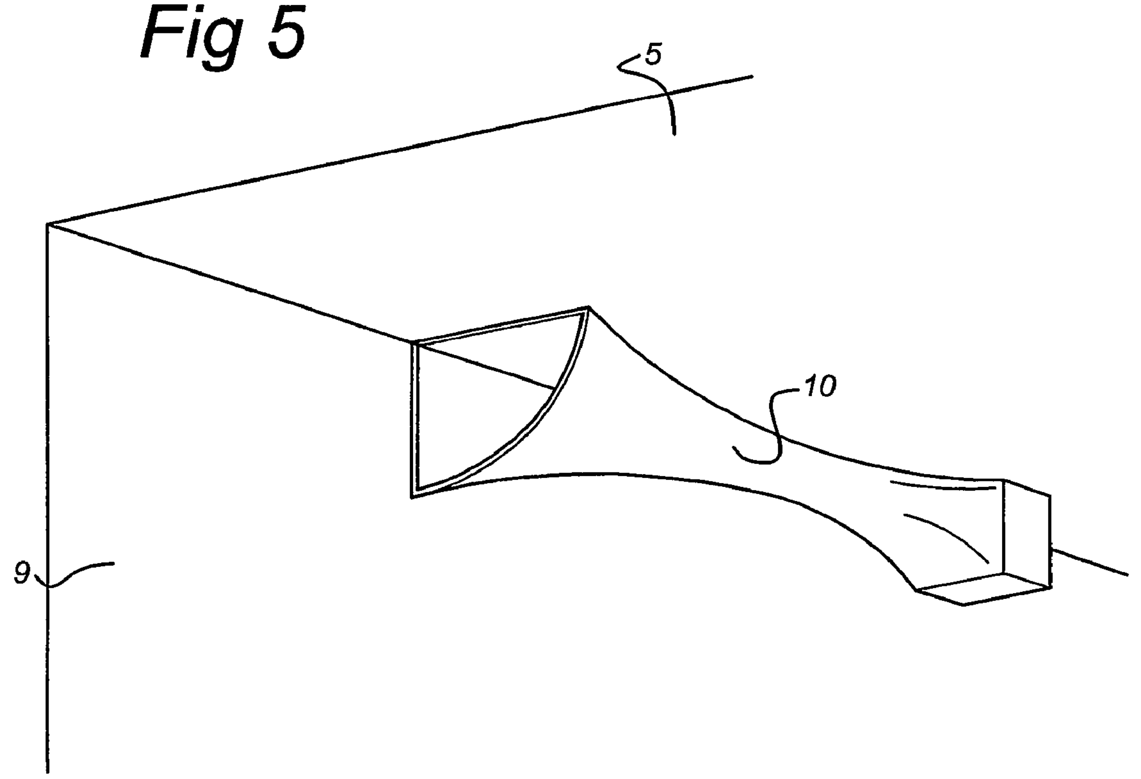
FIG. 5, shows, diagrammatically, a second embodiment of the invention.

If the present invention is used in tunnels, reflections also take place at walls other than the wall on which the transducer 10 is mounted, specifically the side walls of the tunnel. These reflections at the side walls of the tunnel can be reduced by modifying the angle 30 of the horn 13, as has been described above. However, reflections at one side wall 9 can be prevented by having the neck-shaped transition 12 generate a displaced acoustic centre in the form of a point source that is located both in the plane of the ceiling 5 and in the plane of the side wall 9 instead of having it generate a displaced acoustic centre in the form of a line source. A possible embodiment where this is the case is shown in FIG. 5.

Here the transducer 10 is placed in the corner between the side wall 9 of the tunnel and the ceiling 5 of the tunnel, such that the displaced acoustic centre is entirely coincident with the intersection between the side wall 9 of the tunnel and the ceiling 5 of the tunnel. Primary reflections at two walls are prevented in this way.

The angle 30 of the horn 13 can have a wide variety of values and it is even possible to construct a horn 13 with an angle 30 of 360°.

It is also possible to construct a transducer 10 where more than one neck-shaped transitions 12 and/or compression drivers 11 are combined. It is then possible to use different compression drivers 11 and neck-shaped transitions 12, each of which functions in an optimum manner for a specific frequency range, for various frequency ranges. The different neck-shaped transitions 12 can, for example, all adjoin the same horn 13 or adjoin different horns 13. In this way it is possible, for example, to construct a two-way reproduction system or to construct a multi-way reproduction system.

The horn 13 of the transducer 10 can be constructed in various ways known from the state of the art. In a preferred embodiment the horn 13 is of non-folded construction, as is the case in the transducer 10 shown in the Figures. However, it is also possible to construct the horn 13 as a horn with three folds in order to achieve a reduction in depth. However, especially at high frequencies this gives rise to internal reflections and, as a consequence thereof, standing waves in the folded horn of the known transducer 2. This has, in particular, an adverse effect on the acoustic performance of the transducer 2 above 2000 Hz, which frequency range specifically makes an important contribution to the understandability of the acoustic announcement.

The invention claimed is:

1. An acoustic transducer comprising:

at least one sound source for generating an acoustic center; and a predetermined construction for guiding sound generated by the sound source and to be fixed to a fixing wall, wherein the predetermined construction comprises at least one neck-shaped transition that is fixed to the at least one sound source, wherein said neck-shaped transition is constructed to be connected to a horn such that there is a slight kink at the location of the connection of the connection between said neck-shaped transition and the horn, such that, during operation, the generated sound is displaced by the predetermined construction to a displaced acoustic center at a location on the fixing wall when the acoustic transducer is fixed to the fixing wall.

2. An acoustic transducer according to claim 1, wherein the displaced acoustic center is a line source.

3. An acoustic transducer according to claim 1, wherein the displaced acoustic center is a point source.

4. An acoustic transducer according to claim 1, wherein the predetermined construction further comprises at least one horn connected to the at least one neck-shaped transition for guiding sound radiated from the displaced acoustic center to a listener.

5. An acoustic transducer according to claim 4, wherein the horn has a removable horn mouth.

6. An acoustic transducer according to claim 5, wherein at least one of the horn and the removable horn mouth are provided with screening that allows the transmission of sound.

7. An acoustic transducer according to claim 4, wherein the horn has a rectangular cross-section.

8. An acoustic transducer according to claim 7, wherein the cross-section increases exponentially in a direction away from the neck-shaped transition.

9. An acoustic transducer according to claim 4, wherein the at least one sound source, at least one neck-shaped transition, and the at least one horn can be combined for various frequency ranges.

10. An assembly comprising:

(a) at least one fixing wall; and (b) an acoustic transducer according to claim 1, wherein the displaced acoustic center is located on the fixing wall.

11. An assembly according to claim 10, wherein an additional fixing wall is fixed to the at least one fixing wall and the displaced acoustic center is located entirely on an intersection between the fixing wall and the additional fixing wall.

12. An assembly comprising:
(a) at least one fixing wall; and
(b) an acoustic transducer according to claim 2, wherein the displaced acoustic center is located on the fixing wall.

13. An assembly comprising:
(a) at least one fixing wall; and
(b) an acoustic transducer according to claim 3, wherein the displaced acoustic center is located on the fixing wall.

14. An assembly comprising:
(a) at least one fixing wall; and
(b) an acoustic transducer according to claim 1, wherein the displaced acoustic center is located on the fixing wall.

15. An assembly comprising:
(a) at least one fixing wall; and
(b) an acoustic transducer according to claim 4, wherein the displaced acoustic center is located on the fixing wall.

16. An assembly comprising:
(a) at least one fixing wall; and
(b) an acoustic transducer according to claim 5, wherein the displaced acoustic center is located on the fixing wall.

17. An assembly comprising:
(a) at least one fixing wall; and
(b) an acoustic transducer according to claim 6, wherein the displaced acoustic center is located on the fixing wall.

18. An assembly comprising:
(a) at least one fixing wall; and
(b) an acoustic transducer according to claim 7, wherein the displaced acoustic center is located on the fixing wall.

19. An assembly comprising:
(a) at least one fixing wall; and
(b) an acoustic transducer according to claim 8, wherein the displaced acoustic center is located on the fixing wall.

20. An assembly comprising:
(a) at least one fixing wall; and
(b) an acoustic transducer according to claim 9, wherein the displaced acoustic center is located on the fixing wall.

* * * * *